US011150155B2

(12) United States Patent
Pool et al.

(10) Patent No.: US 11,150,155 B2
(45) Date of Patent: Oct. 19, 2021

(54) PRESSURE SENSING DEVICE FOR MEASURING WATER PRESSURE IN A SOIL MEDIUM

(71) Applicant: Fugro N.V., Leidschendam (NL)

(72) Inventors: Arend Daniël Pool, Nieuwegein (NL); Franciscus Antonius Nicolaas Hogervorst, Leidschendam (NL)

(73) Assignee: FUGRO N.V., Leidschendam (NL)

( * ) Notice: Subject to any disclaimer, the term of this patent is extended or adjusted under 35 U.S.C. 154(b) by 127 days.

(21) Appl. No.: 16/713,526

(22) Filed: Dec. 13, 2019

(65) Prior Publication Data

US 2020/0191674 A1    Jun. 18, 2020

(30) Foreign Application Priority Data

Dec. 14, 2018 (NL) ..................................... 2022215

(51) Int. Cl.

| G01L 19/06 | (2006.01) |
|---|---|
| C23C 14/14 | (2006.01) |
| C23C 16/06 | (2006.01) |
| C23C 18/31 | (2006.01) |
| C25D 7/00 | (2006.01) |
| G01L 9/08 | (2006.01) |
| G01L 19/14 | (2006.01) |

(52) U.S. Cl.
CPC .......... *G01L 19/0636* (2013.01); *C23C 14/14* (2013.01); *C23C 16/06* (2013.01); *C23C 18/31* (2013.01); *C25D 7/00* (2013.01); *G01L 9/08* (2013.01); *G01L 19/14* (2013.01)

(58) Field of Classification Search
None
See application file for complete search history.

(56) References Cited

U.S. PATENT DOCUMENTS 8,778,408 B2 *   7/2014   Hirota ..................... B32B 5/022
                                                        424/630
9,113,818 B2 *   8/2015   Brunner ............... A61B 5/0876

FOREIGN PATENT DOCUMENTS

WO    WO 02/05710       1/2002
WO    WO 2018/070875    4/2018

OTHER PUBLICATIONS

Nederlands Search Report, NL 2022215, dated Apr. 11, 2019.

* cited by examiner

*Primary Examiner* — Andre J Allen
*Assistant Examiner* — Jermaine L Jenkins
(74) *Attorney, Agent, or Firm* — Nixon & Vanderhye

(57) ABSTRACT

A pressure sensing device is configured for measuring water pressure in a soil medium, and includes a sensor housing and a pressure sensor. The sensor housing is adapted with a sensor cavity delimited by an enveloping surface. The sensor housing is provided with a selective passage for water between an outer surface of the sensor housing and the sensor cavity. The pressure sensor is arranged within the sensor cavity for measurement of a water pressure within the sensor cavity. The pressure sensing device includes an antimicrobial substance for preventing microbial gas production in the sensor cavity.

20 Claims, 3 Drawing Sheets

PRESSURE SENSING DEVICE FOR MEASURING WATER PRESSURE IN A SOIL MEDIUM

TECHNICAL FIELD

The present invention relates to a pressure sensing device for measuring water pressure in a soil medium. Also, the invention relates to a method for manufacturing such a pressure sensing device.

BACKGROUND

International Patent Application WO201870875 discloses a pore pressure monitoring device for use in geotechnical engineering, adapted to be deployed underground for monitoring pore-water pressure in the surrounding ground, comprising: a pressure sensor cavity, a housing surrounding the sensor cavity, a pressure sensor means, for sensing a fluid pressure of a fluid in the sensor cavity, wherein the cavity is in fluid communication with the surrounding ground, so as to allow equalisation of outside and inside pressure and ensure that no granular/solid pressure is exerted to the pressure sensor means.

Such a device is used in geotechnical engineering for measurement of water pressure in a soil, also known as pore pressure or pore-water pressure. The housing of the device typically is rod-shaped such that it can be inserted in the soil.

The device is provided with a pressure sensor that is arranged within a sensor cavity, internal in the device. Water from the soil is allowed to enter the sensor cavity through a filter that is permeable to water but blocks entrance of solid particles from the soil into the sensor cavity.

However, microbial lifeforms within the water can pass the filter. It is observed that within the sensor cavity microbial life (e.g., bacteria) can develop and disturb the functioning of the pressure sensor due to development of gases i.e., gas bubbles, by the microbial lifeform. Since gas bubbles are compressible, the measurement pressure in the sensor cavity will be disturbed when microbial life produces gas in the water volume inside the sensor cavity.

It is an object of the present invention to overcome or mitigate one or more of the disadvantages from the prior art.

SUMMARY

The object is achieved by a pressure sensing device for measuring water pressure in a soil medium, comprising a sensor housing and a pressure sensor; the sensor housing adapted with a sensor cavity delimited by an enveloping surface; the sensor housing provided with a selective passage for water between an outer surface of the sensor housing and the sensor cavity; the pressure sensor arranged within the sensor cavity for measurement of a water pressure within the sensor cavity, wherein the pressure sensing device comprises an antimicrobial substance in the sensor cavity.

By providing an antimicrobial substance in the sensor cavity, the development of microbial lifeforms is at least strongly reduced which results in preventing or strongly reducing production of gas by microbial lifeforms. In this manner, substantially no gas (bubbles) will be present in the water volume within the sensor cavity during the lifetime of the pressure sensing device. As no compressible substance is present inside the sensor cavity, no effect on the measured pressure will occur.

According to an aspect, the invention provides a pressure sensing device as described above, wherein the antimicrobial substance comprises a metal-based coating within the sensor cavity, covering at least a portion of the enveloping surface of the sensor cavity, at least one metal component of the metal-based coating having antimicrobial properties.

The metal based coating is arranged on at least a portion of the enveloping surface of the sensor cavity and, due to the presence of the metal component as antimicrobial substance, provides that during use the water within the sensor cavity contains some dissolved antimicrobial substance (or a product thereof) which prevents or strongly slows down the development of any microbial lifeform in the sensor cavity.

The metal component can be a metal element or a metal alloy or a metal compound and is specifically selected on its antimicrobial properties in water to impede or block development of microbial life.

According to an aspect, the invention provides a pressure sensing device as described above, wherein the metal-based coating is a thin metal-based film obtained by a thin film deposition process.

According to an aspect, the invention provides a pressure sensing device as described above, wherein the metal-based coating is one selected from a group comprising a metallic film and a metal-compound containing film. According to this embodiment, the metal based coating consists of either a metal layer, a metal-alloy layer or a layer of a metal compound (i.e., a compound of a metal with a non-metallic element or compound, or a chemical reaction product of the metal). In an embodiment, the metal-compound containing film is a thin film which comprises metal component nanoparticles as antimicrobial substance.

According to an aspect, the invention provides a pressure sensing device as described above, wherein the thin film deposition process is one selected from physical vapour deposition, chemical vapour deposition, electrolytic deposition or electroless deposition. The enveloping surface of the sensor cavity can be coated by various techniques to create a metal-based coating or thin film.

According to an aspect, the invention provides a pressure sensing device as described above, wherein the selective passage for water is a fluid-solid filter arranged between the outer surface of the sensor housing and the sensor cavity, and an inner wall of the fluid-solid filter facing the sensor cavity is at least partially covered by the antimicrobial substance.

This embodiment provides that the antimicrobial substance is present on the filter through which water enters the sensor cavity. By the presence of the antimicrobial substance at this location, the effect of reducing development of microbial life in the water is increased as the water passes the antimicrobial substance when entering the sensor cavity.

According to an aspect, the invention provides a pressure sensing device as described above, wherein the fluid-solid filter is a porous filter comprising pores, and walls of the pores are at least partially covered by the antimicrobial substance.

According to an aspect, the invention provides a pressure sensing device as described above wherein the pressure sensor is substantially free from mechanical contact with the antimicrobial substance. In this manner, influence of the antimicrobial substance on the pressure sensor and on the pressure measurement is avoided.

According to an aspect, the invention provides a pressure sensing device as described above, wherein the metal component of the antimicrobial substance is selected from one or more of a group comprising heavy metal based compounds, in which a heavy metal is defined as a metal with a specific density of at least 4.5 g/cm$^3$.

In a further embodiment, the metal component of the antimicrobial substance is selected from one or more of copper based compounds and silver based compounds.

Heavy metals or heavy metal components other than copper based and/or silver based and that have antimicrobial properties can be applied as well as an antimicrobial substance, as will be appreciated by the skilled in the art.

According to an aspect, the invention provides a method for manufacturing a pressure sensing device for measuring water pressure in a soil medium, comprising a sensor housing and a pressure sensor, comprising the steps of providing a sensor housing; providing the sensor housing with a sensor cavity delimited by an enveloping surface; providing a selective passage for water between an outer surface of the sensor housing and the sensor cavity; arranging the pressure sensor within the sensor cavity; arranging an antimicrobial substance in the sensor cavity.

According to an aspect, the invention provides a method as described above, wherein the antimicrobial substance comprises a metal-based coating with at least one metal component of the metal-based coating having antimicrobial properties, and the method comprises the step of arranging the metal-based coating within the sensor cavity, covering at least a portion of the enveloping surface thereof.

According to an aspect, the invention provides a method as described above, wherein the metal-based coating is a thin metal-based film, and the step of arranging the metal-based coating in the sensor cavity comprises depositing the thin metal-based film by a thin film deposition process.

Advantageous embodiments are further defined by the dependent claims.

BRIEF DESCRIPTION OF DRAWINGS

The invention will be explained in more detail below with reference to drawings in which illustrative embodiments thereof are shown. The drawings are intended exclusively for illustrative purposes and not as a restriction of the inventive concept. The scope of the invention is only limited by the definitions presented in the appended claims.

In the drawings, items indicated by the same reference number relate to a same or similar entity or element.

DETAILED DESCRIPTION OF EMBODIMENTS

Figure 1:
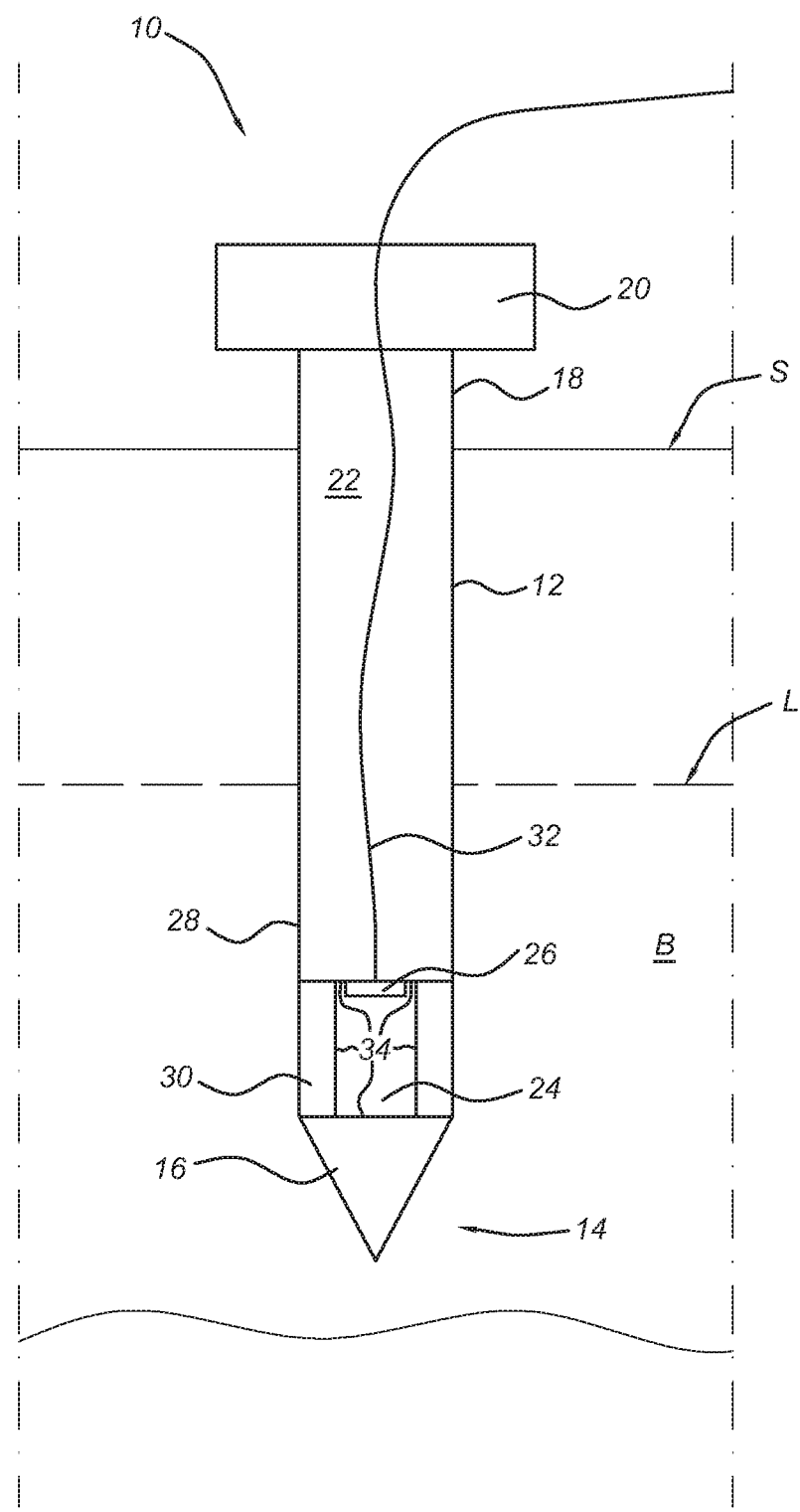
FIG. 1 shows a schematic layout of a probe comprising a pressure sensing device according to an embodiment.

FIG. 1 shows a schematic layout of a probe comprising a pressure sensing device according to an embodiment.

A pressure sensing device as described in this application can be used in geotechnical engineering for measurement of water pressure in a soil B. Within voids and pores in the soil, groundwater can be collected. Typically a water-saturated layer can be found at a level L below the soil's surface S.

The pressure of the groundwater, also known as pore pressure or pore-water pressure, can be measured by a pressure sensing device 10 inserted in the soil S.

In the example of a pressure sensing device shown in FIG. 1, the housing 12 of the pressure sensing device 10 is an elongated body, for example a rod or tube for pushing in the pressure sensing device into the soil.

The housing 12 can consist of a plastic such as Nylon or hard PVC or alternatively of a metal. Depending on the application the housing can be built from a high strength material for maximum expected force. In an embodiment, the housing 12 is made out of a stainless steel or a high strength steel.

At one end 14 of the housing 12 the pressure sensing device 10 comprises a sensor space or sensor cavity 24 for holding a pressure sensor and optionally comprises a cone-shaped tip 16. At the other end 18 of the housing 12, the pressure sensing device 10 may comprise a cap 20, which is designed to close off the interior 22 of the housing 12. Also, the cap 20 can function as a grip.

The sensor cavity 24 provides a pressure measurement chamber for ground water, in which chamber a pressure sensor 26 is located. Between the outer wall 28 of the housing 12 and the sensor cavity 24, a permeable wall 30 is located, which acts as a fluid/solid filter and selectively allows groundwater from the soil S to enter the sensor cavity 24 but blocks introduction of soil material into the sensor cavity 24.

The sensor cavity 24 is limited by an enveloping surface 34 that comprises an upper and lower inner surface 36, 38 of the housing and the inner wall(s) 40 of the permeable wall 30. Here, the upper and lower inner surface 36, 38 define a top and bottom surface of the sensor cavity and the inner wall(s) 40 of the permeable wall 30 define the sidewall(s) surface of the sensor cavity 24.

The pressure sensor 26 is an electric device, for example a piezo-electric sensor. The pressure sensor 26 is connected by conductive wires 32 to an external registration device (not shown) that registers measurements from the pressure sensor 26. The wires 32 extend from the pressure sensor 26 to the registration device through the interior 22 of the housing 12.

According to an embodiment, the pressure sensing device 10 comprises an antimicrobial substance for preventing microbial gas production in the sensor cavity 24. By introducing the antimicrobial substance in the sensor cavity 24, activity of microbial lifeforms such as bacteria that have entered the sensor cavity 24 with the groundwater, is blocked or at least strongly reduced. The presence of the antimicrobial substance substantially blocks the metabolism of the microbial lifeform in the sensor cavity and thus prevents production of gas by the microbial lifeform.

Figure 2:
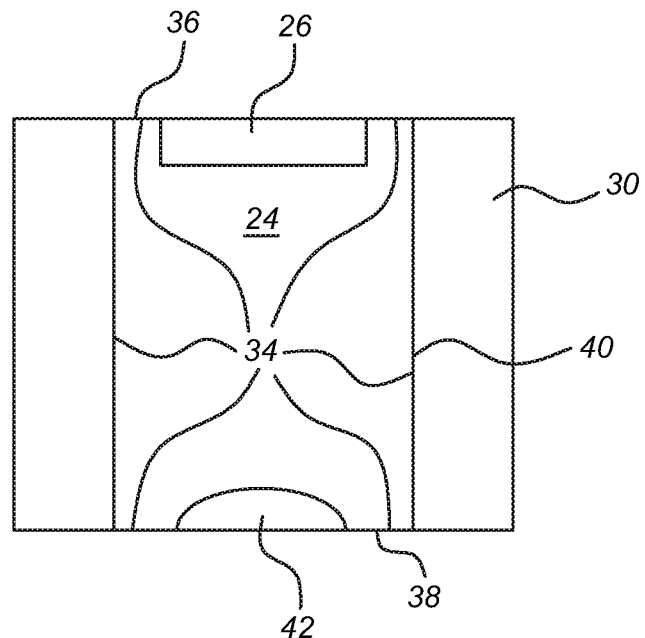
FIG. 2 shows a cross-section of a pressure sensing device according to an embodiment.

FIG. 2 shows a cross-sectional detail of a pressure sensing device according to an embodiment.

The detail of FIG. 2 shows the sensor cavity 24 within the pressure sensing device 10. In this embodiment, an antimicrobial substance 42 in the form of a droplet is located within the sensor cavity 24.

The droplet 42 of the antimicrobial substance can be embodied as a gel body which comprises a component with antimicrobial properties. Thus, a gel body is arranged within the sensor cavity, the gel body comprising the antimicrobial substance.

The gel is configured to slowly release the component into the sensor cavity such that an antimicrobial effect is obtained for a prolonged period of time during which the pressure sensing device 10 is to be operated. A gel could for example be composed of a lipid substance as matrix material and an antimicrobial component such as sodium azide or a metal compound (e.g., metal salt, or metal oxide, metal nitride, etc), but is not limited thereto.

In an embodiment, the gel body is shaped as a thin gel layer or thin gel coating covering at least a portion of the enveloping surface of the sensor cavity.

Alternatively, the droplet 42 can be embodied as a solid body comprising a metal (alloy) or metal-compound, which comprises a metal component with antimicrobial properties. The solid body is configured to slowly release the metal component into the sensor cavity to create an antimicrobial effect in the sensor cavity.

In an embodiment, the metal component of the metal or metal compound is selected from a group of heavy metals (with specific density of at least 4.5 g/cm$^3$. If a further embodiment, the metal component is copper based and/or silver based. Alternatively or additionally, the metal component of the metal or metal compound can be based on one or more metals selected from a group comprising metals that are being increasingly considered for antimicrobial agents within the transition metals of the d-block, (V, Ti, Cr, Co, Ni, Cu, Zn, Tb, W, Ag, Cd, Au, Hg) and other metals and metalloids from groups 13-16 of the periodic table (Al, Ga, Ge, As, Se, Sn, Sb, Te, Pb and Bi). See for example: Biofouling 2010 October; 26(7):851-8. doi: 10.1080/08927014. 2010.527000 or Microb Biotechnol. 2017 September; 10(5): 1062-1065; Published online 2017 Jul. 26. doi: [10.1111/1751-7915.12785].

Such one or more metals could be considered as metal component (metallic constituent) in an antimicrobial substance for application in the pressure sensing device for measuring water pressure in a soil.

Figure 3:
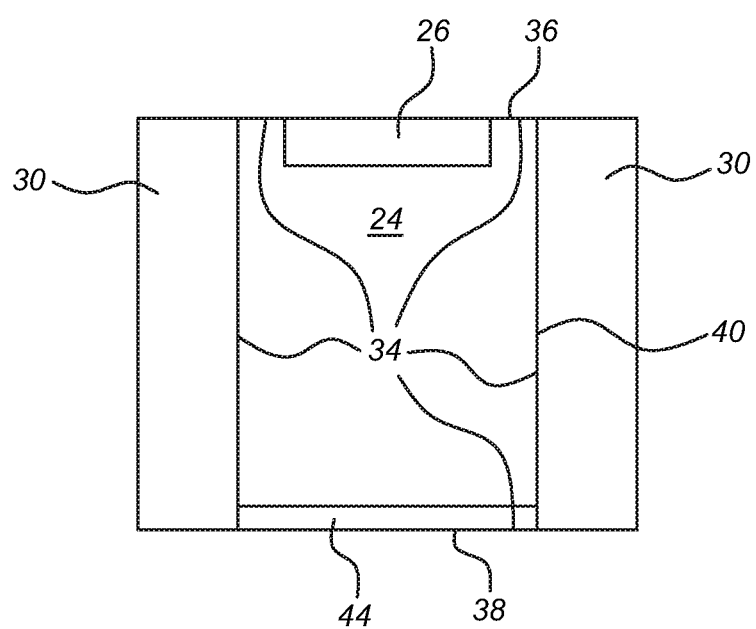
FIG. 3 shows a cross-section of a pressure sensing device according to an embodiment.

FIG. 3 shows a cross-sectional detail of a pressure sensing device according to an embodiment.

The detail of FIG. 3 shows the sensor cavity 24 within the pressure sensing device 10. In this embodiment, an antimicrobial substance in the form of a coating 44 is located on at least the bottom surface of the sensor cavity 24.

The coating 44 may be embodied as a metal-based coating with at least one metal component with antimicrobial properties. The metal-based coating could be one of a metallic film and a metal-compound containing film. According to this embodiment, the metal based coating consists of either a metal layer, a metal-alloy layer or a layer of a metal compound. In a further embodiment, the metal-based coating is a thin metal-based film, which is obtained by a deposition process on at least the bottom surface of the sensor cavity.

The deposition process can be performed using various deposition technologies: physical vapour deposition, chemical vapour deposition, electrolytic deposition (such as electroplating), electroless deposition, electrospraying or plasma spraying.

In an alternative embodiment, the coating 44 is based on a layer of an antimicrobial gel material that is arranged on the bottom surface of the sensor cavity, for example by deposition, spraying, painting or printing.

The creation of the metal-based or gel-based coating may include a masking to create the coating only on selected areas of the sensor cavity 24.

Figure 4:
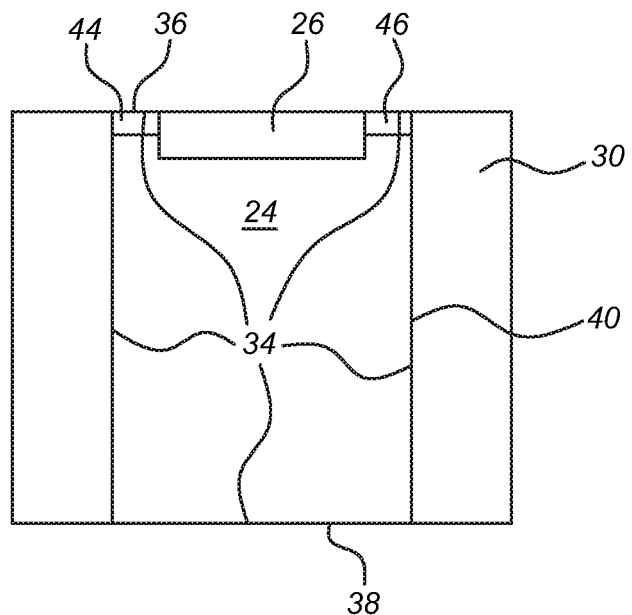
FIG. 4 shows a cross-section of a pressure sensing device according to an embodiment.

FIG. 4 shows a cross-sectional detail of a pressure sensing device according to an embodiment.

The detail of FIG. 4 shows the sensor cavity 24 within the pressure sensing device 10. In this embodiment, an antimicrobial substance in the form of a coating 46 is located on at least the top surface of the sensor cavity 24, surrounding the pressure sensor 26.

Similar to the coating 44 as described above with reference to the embodiment of FIG. 3, the coating 46 is in one embodiment a metal-based coating or metal-based thin film with antimicrobial properties. In an alternative embodiment the coating 46 is based on a layer of an antimicrobial gel material.

Figure 5:
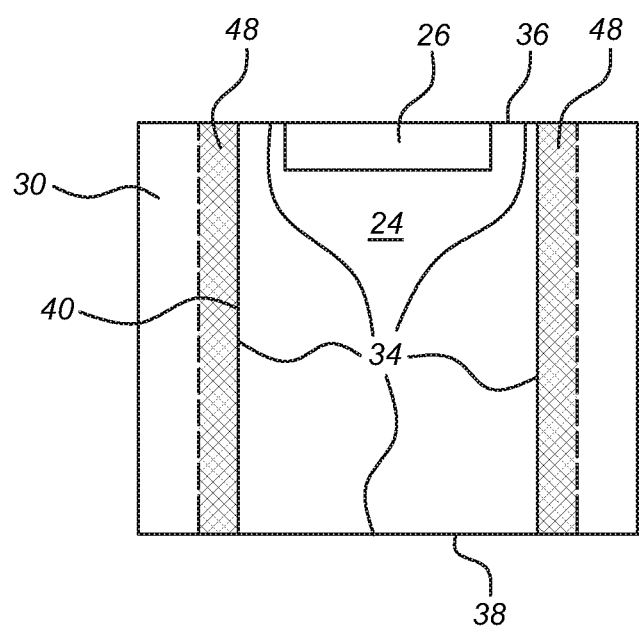
FIG. 5 shows a cross-section of a pressure sensing device according to an embodiment.

FIG. 5 shows a cross-sectional detail of a pressure sensing device according to an embodiment.

The detail of FIG. 5 shows the sensor cavity 24 within the pressure sensing device 10. In this embodiment, an antimicrobial substance in the form of a coating 48 is located on at least the surface of inner wall(s) 40 of the permeable wall 30, surrounding the pressure sensor 26.

According to this embodiment, the coating 48 is arranged on the surface of the inner wall 40, without blocking the pores of the permeable wall 30.

To create the coating 48, the deposition process is configured to produce a solid layer predominantly on the surface material of the porous medium surrounding the pores thereof and substantially not blocking the pores of the porous medium.

Similar to the coating 44, 46 as described above with reference to the embodiment of FIG. 3 and FIG. 4, the coating 48 is in one embodiment a metal-based coating or metal-based thin film with antimicrobial properties. In an alternative embodiment the coating 48 is based on a layer of an antimicrobial gel material.

As will be appreciated by the skilled in the art, the embodiments as described above with reference to FIGS. 3, 4 and 5 could be combined in various manners. In a further embodiment, an antimicrobial coating is arranged on a combination of the top and bottom surfaces 36, 38 of the sensor cavity, or on the bottom surface 38 and the inner wall surface 40, or on the top surface 36 and the inner wall surface 40, or on the top surface 36, the bottom surface 38 and the inner wall surface 40.

The invention has been described with reference to some embodiments. Obvious modifications and alterations will occur to others upon reading and understanding the preceding detailed description.

In addition, modifications may be made to adapt a particular layout or material to the teachings of the invention without departing from the scope thereof. In particular, combinations of specific features of various aspects of the invention may be made. An aspect of the invention may be further advantageously enhanced by adding a feature that was described in relation to another aspect of the invention.

Therefore, it is intended that the invention not be limited to the particular embodiments disclosed, but that the invention includes all modifications insofar as they come within the scope of the appended claims.

The invention claimed is:

1. A pressure sensing device for measuring water pressure in a soil medium, comprising a sensor housing and a pressure sensor;
   the sensor housing adapted with a sensor cavity delimited by an enveloping surface;
   the sensor housing provided with a selective passage for water between an outer surface of the sensor housing and the sensor cavity;
   the pressure sensor arranged within the sensor cavity for measurement of a water pressure within the sensor cavity, wherein the pressure sensing device comprises an antimicrobial substance for preventing microbial gas production in the sensor cavity.

2. The pressure sensing device according to claim 1, wherein the antimicrobial substance comprises a metal-based coating within the sensor cavity, covering at least a portion of the enveloping surface of the sensor cavity;

at least one metal component of the metal-based coating having antimicrobial properties.

3. The pressure sensing device according to claim 2, wherein the metal-based coating is a thin metal-based film obtained by a thin film deposition process.

4. The pressure sensing device according to claim 3, wherein the thin film deposition process is one selected from physical vapour deposition, chemical vapour deposition, electrolytic deposition or electroless deposition.

5. The pressure sensing device according to claim 4, wherein the selective passage for water is a fluid-solid filter arranged between the outer surface of the sensor housing and the sensor cavity, and an inner wall of the fluid-solid filter facing the sensor cavity is at least partially covered by the antimicrobial substance.

6. The pressure sensing device according to claim 3, wherein the metal-based coating is one selected from a group comprising a metallic film and a metal-compound containing film.

7. The pressure sensing device according to claim 3, wherein the selective passage for water is a fluid-solid filter arranged between the outer surface of the sensor housing and the sensor cavity, and an inner wall of the fluid-solid filter facing the sensor cavity is at least partially covered by the antimicrobial substance.

8. The pressure sensing device according to claim 2, wherein the metal-based coating is one selected from a group comprising a metallic film and a metal-compound containing film.

9. The pressure sensing device according to claim 8, wherein the thin film deposition process is one selected from physical vapour deposition, chemical vapour deposition, electrolytic deposition or electroless deposition.

10. The pressure sensing device according to claim 8, wherein the selective passage for water is a fluid-solid filter arranged between the outer surface of the sensor housing and the sensor cavity, and an inner wall of the fluid-solid filter facing the sensor cavity is at least partially covered by the antimicrobial substance.

11. The pressure sensing device according to claim 2, wherein the selective passage for water is a fluid-solid filter arranged between the outer surface of the sensor housing and the sensor cavity, and an inner wall of the fluid-solid filter facing the sensor cavity is at least partially covered by the antimicrobial substance.

12. The pressure sensing device according to claim 2, wherein the pressure sensor is substantially free from mechanical contact with the antimicrobial substance.

13. The pressure sensing device according to claim 1, wherein the selective passage for water is a fluid-solid filter arranged between the outer surface of the sensor housing and the sensor cavity, and an inner wall of the fluid-solid filter facing the sensor cavity is at least partially covered by the antimicrobial substance.

14. The pressure sensing device according to claim 13, wherein the fluid-solid filter is a porous filter comprising pores, and walls of the pores are at least partially covered by the antimicrobial substance.

15. The pressure sensing device according to claim 1, wherein the pressure sensor is substantially free from mechanical contact with the antimicrobial substance.

16. The pressure sensing device according to claim 1, wherein the antimicrobial substance is a compound based on a metal component wherein the metal component is selected from one or more of a group comprising heavy metals.

17. The pressure sensing device according to claim 16, wherein the antimicrobial substance is selected from a group comprising at least copper based compounds and silver based compounds.

18. A method for manufacturing a pressure sensing device for measuring water pressure in a soil medium, comprising a sensor housing and a pressure sensor, comprising the steps of
providing a sensor housing;
providing the sensor housing with a sensor cavity delimited by an enveloping surface;
providing a selective passage for water between an outer surface of the sensor housing and the sensor cavity;
arranging the pressure sensor within the sensor cavity;
arranging an antimicrobial substance for preventing microbial gas production in the sensor cavity.

19. The method according to claim 18, wherein the antimicrobial substance comprises a metal-based coating with at least one metal component of the metal-based coating having antimicrobial properties, and the method comprises the step of arranging the metal-based coating within the sensor cavity, covering at least a portion of the enveloping surface thereof.

20. The method according to claim 19, wherein the metal-based coating is a thin metal-based film, and the step of arranging the metal-based coating in the sensor cavity, covering at least a portion of the enveloping surface thereof, comprises depositing the thin metal-based film by a thin film deposition process.

* * * * *